US006624639B2

(12) United States Patent
Schiffer

(10) Patent No.: US 6,624,639 B2
(45) Date of Patent: Sep. 23, 2003

(54) MOLDED PLASTIC COAXIAL CONNECTOR

(75) Inventor: Jeffrey L. Schiffer, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/992,895

(22) Filed: Nov. 5, 2001

(65) Prior Publication Data

US 2003/0085716 A1 May 8, 2003

(51) Int. Cl.[7] .................... H01H 31/04; H01R 12/00; H01R 13/28; H01R 25/00; H05K 1/00

(52) U.S. Cl. .................... 324/538; 439/65; 439/66; 439/74; 439/290

(58) Field of Search .................... 324/538, 537; 257/686; 439/65, 66, 74, 75, 290; 361/733, 735

(56) References Cited

U.S. PATENT DOCUMENTS 4,861,271 A * 8/1989 Bogar et al. .................. 439/63
5,035,651 A * 7/1991 Dixon et al. ................ 439/609
5,068,602 A * 11/1991 Mielke ...................... 324/755
5,266,912 A * 11/1993 Kledzik ...................... 333/247
6,250,933 B1 * 6/2001 Khoury et al. ................ 439/66
6,443,782 B1 * 9/2002 Mitani ........................ 439/752
6,476,476 B1 * 11/2002 Glenn ........................ 257/686

* cited by examiner

*Primary Examiner*—Walter E. Snow
*Assistant Examiner*—John Teresinski
(74) *Attorney, Agent, or Firm*—Blakely, Sokoloff, Taylor & Zafman LLP

(57) ABSTRACT

A molded plastic coaxial connector. The coaxial connector is fabricated within a stacking connector system of a mini PCI card. A plastic protuberance having a cavity and a corresponding depression having a center conductor pin are molded to the dimensions corresponding to a desired characteristic impedance. The plastic is then coated with a conductive material. When the protuberance is mated to the depression, the coated surfaces of each form the ground shield of a coaxial connection and the center conducting pin is mated to the cavity to form the drive point of the coaxial connection. Fabricating the coaxial connection from plastic reduces the number of processes and eliminates the need for individually machined parts, thereby reducing the production costs. In one embodiment multiple coaxial connectors may be implemented along a single piece of plastic. This allows for reduction in size as the tolerance buildup of conventional coaxial connectors is avoided.

29 Claims, 6 Drawing Sheets

MOLDED PLASTIC COAXIAL CONNECTOR

FIELD OF THE INVENTION

This invention relates generally to coaxial connectors, and more specifically to the implementation of multiple molded plastic coaxial connections in a stacking connector for a mini PCI card.

BACKGROUND OF THE INVENTION

Space-constrained mobile computing systems (MCSs) such as notebook and laptop computers and PDAs use miniature versions of PCI cards (Mini PCI cards). Mini PCI cards are cards with wired functionality and are the equivalent for a MCS of the option cards of a personal computer. These cards may be only 40 mm by 60 mm compared to a standard PCI card which may typically be 20 cm×8 cm. Multi-function mini PCI cards (cards) that implement wireless functions in a MCS require a means for connecting one or more antennas to the card. For example, currently, two wireless standards being implemented in MCSs are the Institute of Electrical and Electronic Engineers' (IEEE) wireless LAN equipment standards IEEE Standard 802.11a (operating frequency 5.2 GHz) and IEEE Standard 802.11b (operating frequency 2.4 GHz). A card may require two antennas to support each of these standards, for a total of four antennas to support both standards.

A major consideration in implementing an antenna is to achieve a low loss connection. To provide low loss, the characteristic impedance of the connection must match that of the antenna. This means that the characteristic impedance of the connection must remain stable, ideally over a wide frequency range. A coaxial connection is one suitable connection for the transmission of high frequency signals. Coaxial connectors have an outer conductor separated, by a dielectric material, from an inner conductor. The diameter of the inner conductor, the diameter of the outer conductor, and the dielectric constant of the material separating them, determines the characteristic impedance of the connection.

FIG. 1A illustrates a typical card with four coaxial connectors in accordance with the prior art. System 100, shown in FIG. 1A, includes a motherboard 105. The motherboard is the main circuit board for the MCS and typically includes the CPU, bus, and other components. A card 115 may be connected (interfaced) to the motherboard 105 via a stacking system connector 110. A typical stacking system connector may have 100 or more pins and be 4 mm or less in height. The example card 115 contains a set of four coaxial connectors 120 along with other components 125. The set of coaxial connectors 120 may be any one of various familiar types of coaxial connector such as SMA, BNC, subminiature coax, or others. Each of the coaxial connectors 120 is connected via a coaxial cable to an antenna, not shown. FIG. 1B is a side view of system 100 and includes antenna 130B connected via coaxial connectors 120 directly to card 115.

This scheme has a number of drawbacks. The first is that the coaxial connectors, though small, still take up a considerable amount of the card space. Another drawback is that having four cables connected to the card adds to the connection complexity and increases the likelihood of a misconnection. Also, four cables floating around in the highly space-constrained MCS add significantly to the chance of shorting out other components. If the solution is build to order/configure to order, the chance of putting the wrong cable on a connector is very high.

Placing the coaxial connectors within a stacking system connector (i.e., feeding the RF signal through the stacking system connector) would address most of these concerns. The cables could be permanently attached to the motherboard. Then when a card is plugged in a connection would be made between the card and the antennas through the motherboard. However, coaxial connectors, as they are currently manufactured, present several obstacles to being implemented within a stacking connector system. First, even the smallest of coaxial connectors are relatively large compared to a stacking connector system. Second, a typical coaxial connector has some individually machined components that are expensive and tend to increase the size of the coaxial connector.

FIG. 2A illustrates several coaxial connectors in accordance with the prior art. Connector 200 has four coaxial connectors 201–204 each having individually machine parts. Due to the tolerance buildup across connector 200 the coaxial connectors cannot be fixed within housing 205. In order for the coaxial connectors to line up for proper mating some mechanical floating is necessary within housing 205. That is the coaxial connectors must be able to shift slightly for proper mating.

FIG. 2B illustrates a side view of coaxial connectors 201 and 202. The socket of each connector is not fixed within plastic 207, but is able to shift. The buildup of tolerances over several coaxial connectors tends to increase the size of connector 200.

BRIEF DESCRIPTION OF THE DRAWINGS

The present invention is illustrated by way of example, and not limitation, by the figures of the accompanying drawings in which like references indicate similar elements and in which.

DETAILED DESCRIPTION

A coaxial connector is described that is fabricated within a stacking connector system connecting a mini PCI card to a MCS motherboard. In one embodiment the coaxial connector is fabricated from, and fixed within, the plastics of the stacking connector system. The plastic is molded to the desired dimensions and then plated. This reduces the number of processes and eliminates the need for individually machined parts normally required by coaxial connectors, thereby reducing the production costs. In one embodiment multiple coaxial connectors may be implemented along a single piece of plastic. This allows for a significant reduction in connector size, and avoids the tolerance buildup issues of prior art coaxial connectors.

Figure 1A:
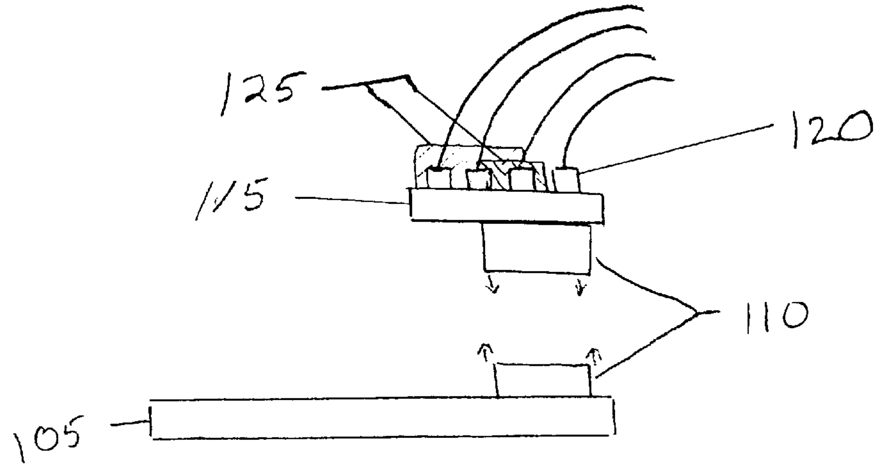
Fig. 1A Prior Art
FIGS. 1A and 1B illustrate a mini PCI card with four coaxial connectors in accordance with the prior art.
Figure 1B:
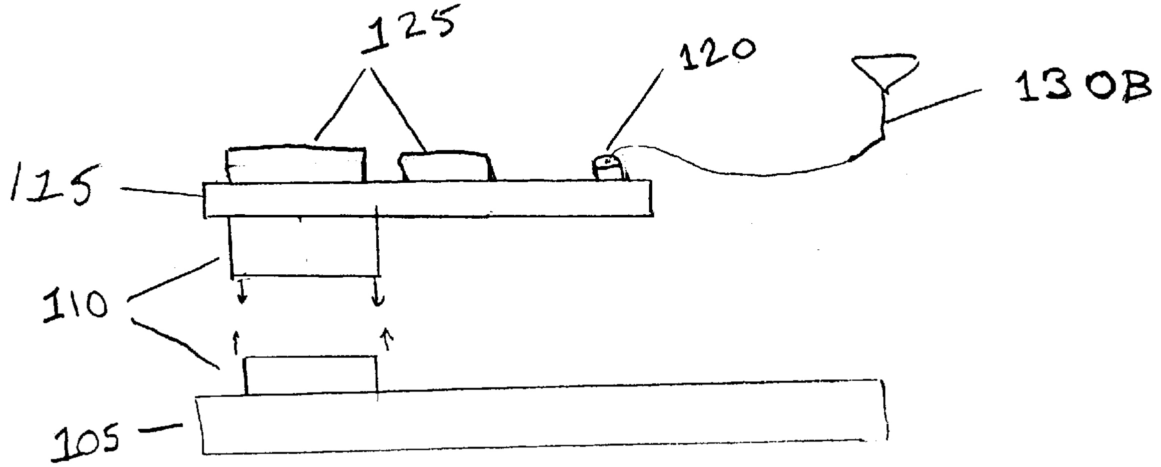
Fig. 1B Prior Art
Figure 2A:
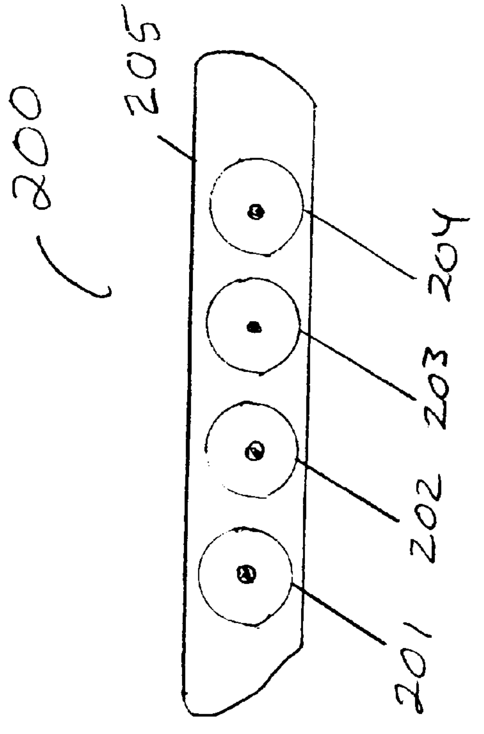
Fig. 2A Prior Art
FIGS. 2A and 2B illustrate coaxial connectors in accordance with the prior art.
Figure 2B:
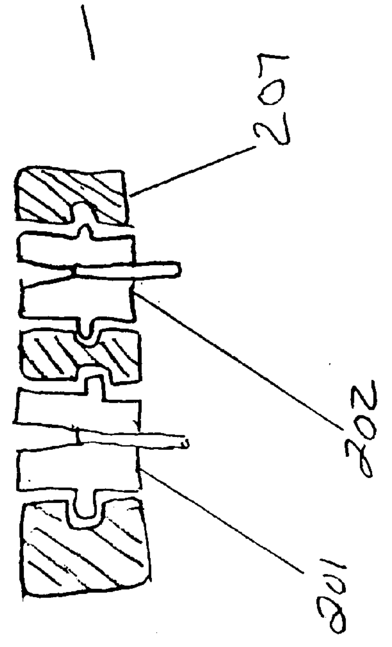
Fig. 2B Prior Art
Figure 3A:
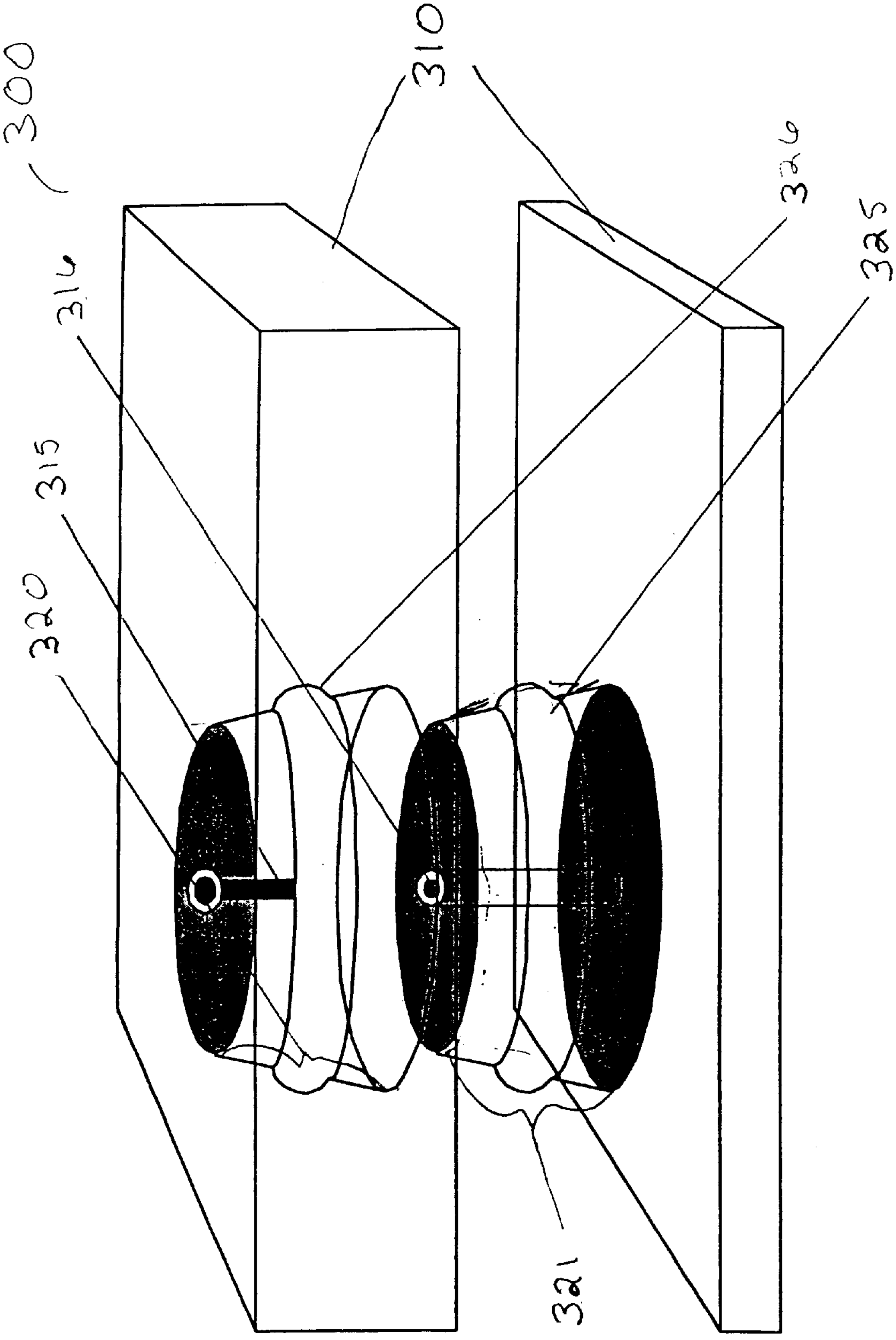
FIGS. 3A and 3B illustrate a molded plastic coaxial connector in accordance with one embodiment of the present invention.

FIG. 3A illustrates a molded plastic coaxial connector in accordance with one embodiment of the present invention. The coaxial connector 300, shown in FIG. 3, is made from molded plastic and is fabricated within a stacking connector system. The upper portion of the stacking connector system 310 is molded to have a cylindrical depression while the lower portion of stacking connector system 310 has a corresponding protuberance. Centrally located within the depression is a connector pin 315 that forms the center conductor of the coaxial connector. When mated the connector pin 315 will be inserted into a socket 316 molded within the protuberance of the lower portion of the stacking system connector 310. The lateral surface area 320 of the depression, and the lateral surface area 321, of the protuberance are coated with a conducting material. For one embodiment the conducting materiel may be copper with gold overlay. In an alternative embodiment the conducting material may be copper with tin overlay. The method of coating the surfaces is not critical. In one embodiment the conducting material may be deposited upon the lateral surfaces while in an alternative embodiment the conducting material may be painted on the lateral surfaces. When mated, the conducting material on the lateral surface of the depression in contact with the conducting material on the lateral surface of the protuberance will form the ground shield of the coaxial connector. The shield from a cable that will attach to the coaxial connector 300 is connected to this plated area. A "bump" 325 is formed on the lateral surface of the protuberance and a corresponding indentation 326 is formed on the lateral surface of the depression. The mating process will slightly deform the bump and result in a good ground contact all around and provide positive retention. This robust connection is important to ensure stable characteristic impedance of the connection over a wide range of frequencies.

The diameter of the connector pin, and the diameter of the protuberance and depression, are selected in conjunction with the dielectric constant of the molded plastic to provide the desired characteristic impedance. In one embodiment these values are selected such that a characteristic impedance of 50 ohms results.

Figure 3B:
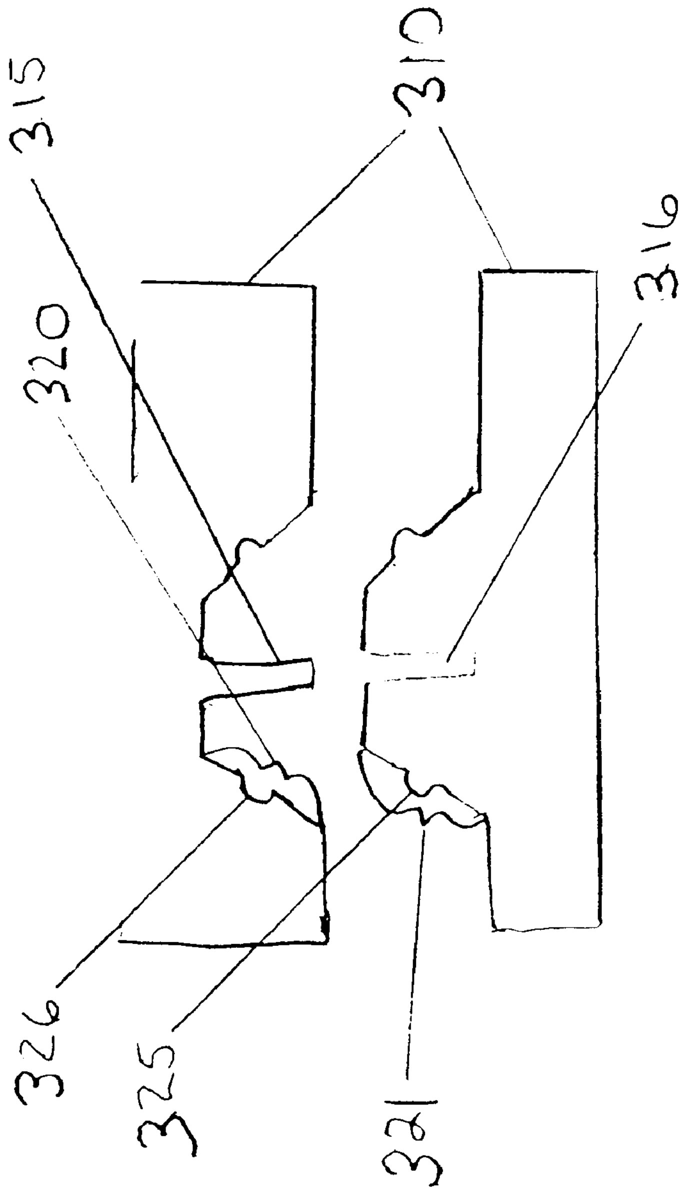

FIG. 3B illustrates a cutaway view of the molded plastic coaxial connector of FIG. 3A.

In an alternative embodiment the coaxial connector could be made using a small plastic cube (i.e., a plastic cube is used as the dielectric to separate the conducting ground shield and the center conductor). In this embodiment a cube and a corresponding depression are molded from plastic. The lateral surface of the cube and the lateral surface of the depression are coated with a conductor. When mated these metal surfaces form the ground shield. Alternatively, a thin protruding metal plate held against the plastic cube could be used to effect the ground shield. This would negate the need for the conductor deposition process and may, therefore, reduce production costs.

Figure 4:
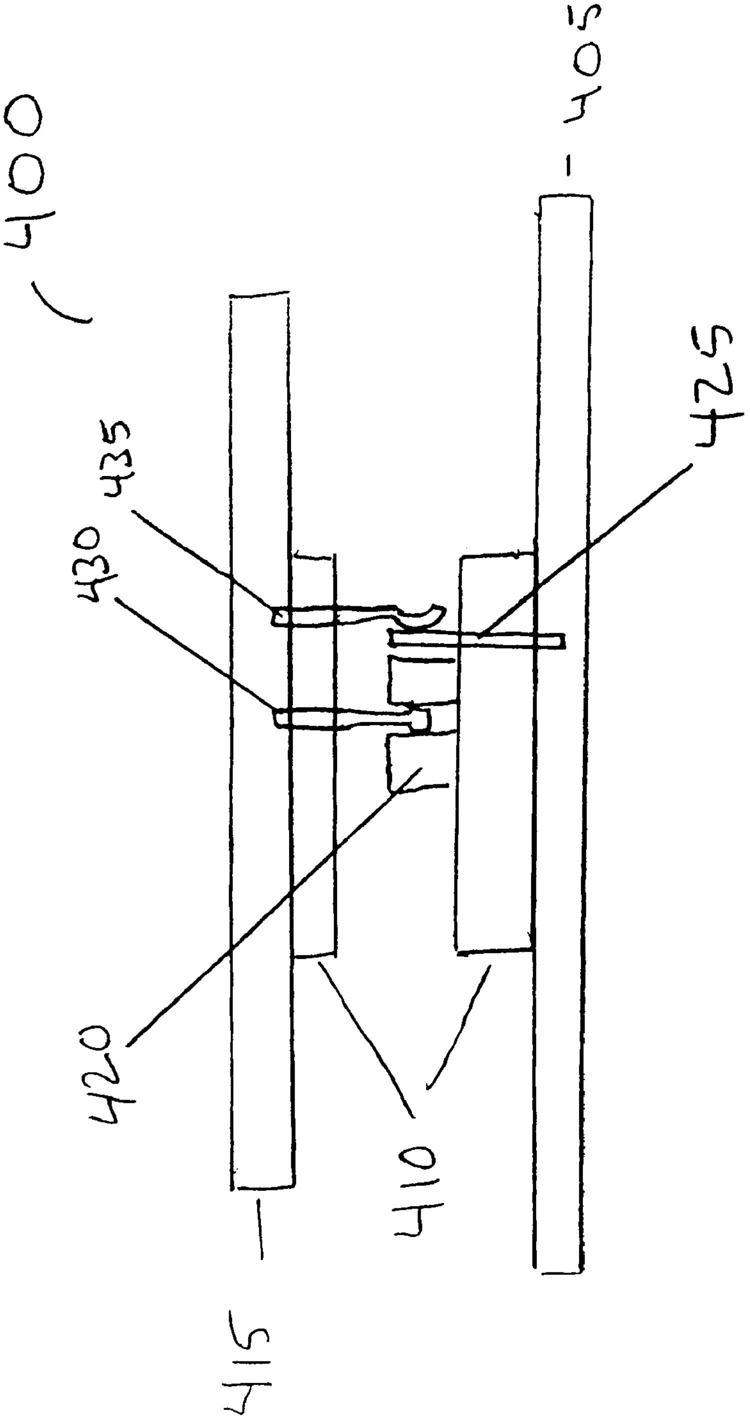
FIG. 4 illustrates a molded plastic coaxial conductor in accordance with one embodiment of the present invention.

FIG. 4 illustrates a coaxial conductor formed from a molded plastic cube using a metal plate to form the ground shield. System 400, shown in FIG. 4, includes a motherboard 405, a stacking connector system 410, and a card 415. The stacking connector system 410 has a coaxial connector formed within it. The coaxial connector includes a molded plastic post 420 with a vacant area (socket) formed at its center. A thin metal plate 425 extends through the stacking connector system 410 and is held against the post 420. The thin metal plate 425 extends through stacking connector system 410 so that it can be soldered to the motherboard 405. The mating piece of the coaxial connector includes center pin 430 which mates into the socket and a slightly deformed metal rod 435 that would be forced into contact with thin metal plate 425 to form the ground shield. Center pin 430 and metal rod 435 extend through stacking connector system 410 so that they can be soldered to the card 415.

Figure 5:
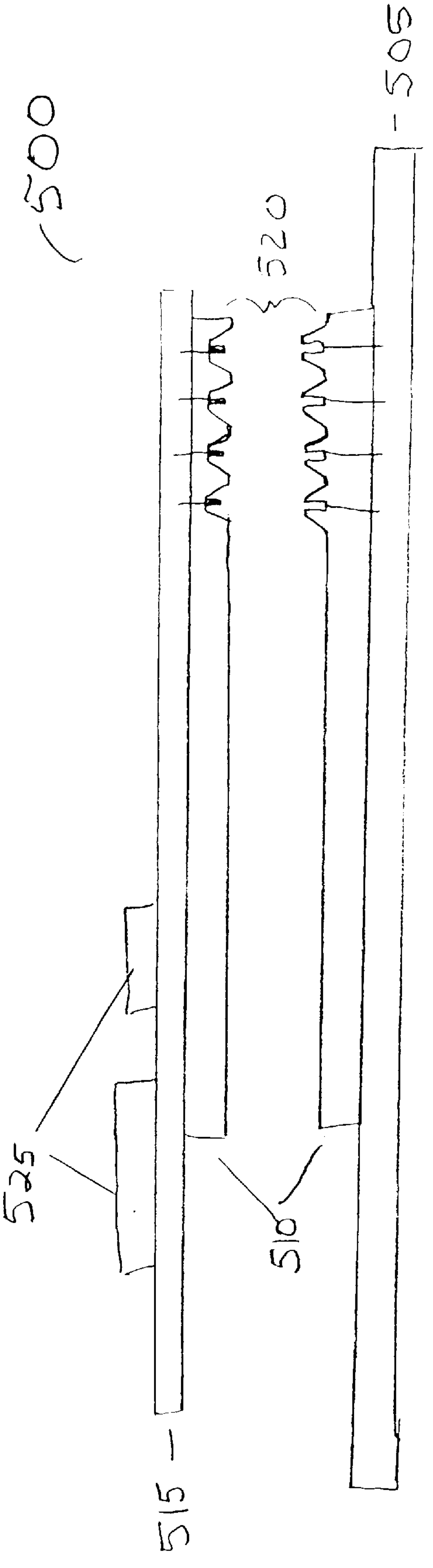
FIG. 5 illustrates a mini PCI card with four molded plastic coaxial connectors in accordance with the present invention.

FIG. 5 illustrates a mini PCI card with four molded plastic coaxial connectors in accordance with the present invention. System 500, shown in FIG. 5, includes a motherboard 505 and a card 515 having various components 525. Card 515 is interfaced to motherboard 505 by stacking connector system 510. The stacking connector system 510 has fabricated within it a set of coaxial connectors 520. The motherboard 505 has attached to it cables connecting card 515 with a number of antennas, not shown.

By fabricating the coaxial connectors 520 from molded plastic it is possible to make them smaller than conventional coaxial connectors. The coaxial connectors 520 do not have individually machined parts so they may be less costly to produce. In addition, the molded plastic coaxial connectors 520 do not require mechanically floating components and may, therefore, be easier to implement within a stacking connector system. Thus, molded plastic coaxial connectors avoid the drawbacks of prior art coaxial connectors containing individually machined components.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus comprising:

a protuberance molded in plastic having a lateral surface, the lateral surface coated with a conductive material, the protuberance having a cavity formed therein;

a depression molded in plastic corresponding to the protuberance, the depression having a lateral surface, the lateral surface coated with the conductive material; such that when the protuberance is placed within the depression the lateral surface of the protuberance contacts the lateral surface of the depression forming a ground shield of a coaxial connection; and a center conducting pin, corresponding to the cavity, the center conducting pin formed within the depression such that when the protuberance is placed within the depression the center conducting pin is inserted into the cavity forming a drive point of the coaxial connection.

2. The apparatus of claim 1 wherein the conductive metal is copper with gold overlay.

3. The apparatus of claim 1 wherein the conductive metal is copper with tin overlay.

4. The apparatus of claim 1 wherein the conductive material is deposited upon the lateral surface.

5. The apparatus of claim 1 wherein the conductive material is painted upon the lateral surface.

6. The apparatus of claim 1 wherein a diameter of the protuberance, a diameter of the center conducting pin, and a dielectric constant of the plastic are selected such that the coaxial connection has a desired characteristic impedance.

7. The apparatus of claim 6 wherein the characteristic impedance is approximately 50 ohms.

8. The apparatus of claim 6 wherein the characteristic impedance is approximately 75 ohms.

9. The apparatus of claim 1 further comprising:

a bump formed upon the protuberance; and an indentation corresponding to the bump formed upon the depression such that when the protuberance is placed within the depression the bump is forced into the indentation providing a robust connection between the lateral surface of the protuberance and the lateral surface of the depression.

10. A device comprising:

a PCI card;

a stacking connector system coupled to the mini PCI card, the stacking connector system having formed therein a plurality of coaxial connectors, the plurality of coaxial connectors molded from plastic and wherein each coaxial connector comprises:

a protuberance having a lateral surface, the lateral surface coated with a conductive material, the protuberance having a cavity formed therein;

a depression corresponding to the protuberance, the depression having a lateral surface, the lateral surface coated with the conductive material; such that when the protuberance is place within the depression the lateral surface of the protuberance contacts the lateral surface of the depression forming a ground shield of the coaxial connector; and a center conducting pin, corresponding to the cavity, the center conducting pin formed within the depression such that when the protuberance is placed within the depression the center conducting pin is inserted into the cavity forming a drive point of the coaxial connector.

11. The device of claim 10 wherein the conductive metal is copper with gold overlay.

12. The device of claim 10 wherein the conductive metal is copper with tin overlay.

13. The device of claim 10 wherein the conductive material is deposited upon the lateral surface.

14. The device of claim 10 wherein the conductive material is painted upon the lateral surface.

15. The device of claim 10 wherein a diameter of the protuberance, a diameter of the center conducting pin, and a dielectric constant of the plastic are selected such that the coaxial connection has a desired characteristic impedance.

16. The device of claim 15 wherein the characteristic impedance is approximately 50 ohms.

17. The device of claim 15 wherein the characteristic impedance is approximately 75 ohms.

18. The device of claim 10 further comprising:

a bump formed upon the protuberance; and an indentation corresponding to the bump formed upon the depression such that when the protuberance is placed within the depression the bump is forced into the indentation providing a robust electrical connection between the lateral surface of the protuberance and the lateral surface of the depression.

19. A coaxial connector comprising:

a first portion of the coaxial connector having 1) a post fanned from molded plastic, the post having a cavity formed therein, and 2) a metal sheet held against the post; and a second portion of the coaxial connector having 1) a central connector pin positioned so that when the first portion of the coaxial connector is mated with the second portion of the coaxial connector the central conducting pin will be inserted into the cavity forming the drive point of the coaxial connection, and 2) a metal rod positioned Bach that when the first portion of a coaxial connector is mated with the second portion of the coaxial connector the metal rod will contact the metal sheet forming the ground shield of the coaxial connection.

20. The coaxial connector of claim 19 wherein a dimension of the post, a dimension of the center con ducting pin, and a dielectric constant of the plastic are selected such that the coaxial connection has a desired characteristic impedance.

21. The coaxial connector of claim 19 wherein the characteristic impedance is approximately 50 ohms.

22. The coaxial connector of claim 19 wherein the characteristic impedance is approximately 75 ohms.

23. A method comprising:

molding a protuberance in plastic, the protuberance having 1) a lateral surface and 2) a cavity formed therein;

coating the lateral surface of the protuberance with a conductive material;

molding a depression in plastic, corresponding to the protuberance, the depression having 1) a lateral surface and 2) a center conductor pin formed thereon, the center conductor pin corresponding to the cavity;

coating the lateral surface of the depression with the conductive material; and placing the protuberance within the depression such that the lateral surface of the protuberance contacts the lateral surface of the depression fanning a ground shield of a coaxial connection and the center conducting pin is inserted into the cavity fanning a drive point of the coaxial connection.

24. The method of claim 23 wherein the conductive metal is copper with gold overlay.

25. The method of claim 23 wherein the conductive metal is copper with tin overlay.

26. The method of claim 23 wherein the conductive material is deposited upon the lateral surface.

27. The apparatus of claim 23 wherein the conductive material is painted upon the lateral surface.

28. The method of claim 23 wherein a diameter of the protuberance, a diameter of the center conducting pin, and a dielectric constant of the plastic are selected such that the coaxial connection has a desired characteristic impedance.

29. The method of claim 28 wherein the characteristic impedance is approximately 75 ohms.

* * * * *